United States Patent
Bowyer et al.

(10) Patent No.: US 11,842,645 B2
(45) Date of Patent: Dec. 12, 2023

(54) WIRELESS COMMUNICATION

(71) Applicant: Airbus Defence and Space Limited, Stevenage (GB)

(72) Inventors: Mark Bowyer, Stevenage (GB); Michael Pritchard, Stevenage (GB); Howard Jackson, Stevenage (GB)

(73) Assignee: Airbus Defence and Space Limited, Stevenage (GB)

( * ) Notice: Subject to any disclaimer, the term of this patent is extended or adjusted under 35 U.S.C. 154(b) by 88 days.

(21) Appl. No.: 17/614,229

(22) PCT Filed: May 28, 2020

(86) PCT No.: PCT/GB2020/051289
§ 371 (c)(1),
(2) Date: Nov. 24, 2021

(87) PCT Pub. No.: WO2020/240183
PCT Pub. Date: Dec. 3, 2020

(65) Prior Publication Data
US 2022/0215761 A1      Jul. 7, 2022

(30) Foreign Application Priority Data

May 28, 2019   (GB) ...................................... 1907510

(51) Int. Cl.
*G08G 5/00*       (2006.01)
*H04W 56/00*     (2009.01)

(52) U.S. Cl.
CPC ......... *G08G 5/0004* (2013.01); *G08G 5/0017* (2013.01); *H04W 56/003* (2013.01); *H04W 56/0095* (2013.01)

(58) Field of Classification Search
CPC ............. B60W 60/01; B60W 2420/42; B60W 2420/52; B60W 2554/4048; G06V 20/58;
(Continued)

(56) References Cited

U.S. PATENT DOCUMENTS 8,077,652 B2   12/2011   Thesling
8,238,284 B2    8/2012   Wilcoxson et al.
(Continued)

FOREIGN PATENT DOCUMENTS

CN    102521503 B    6/2012
CN    108287962 A    7/2018
(Continued)

OTHER PUBLICATIONS

International Search Report; priority document.
(Continued)

*Primary Examiner* — Thomas Ingram
(74) *Attorney, Agent, or Firm* — Greer, Burns & Crain, Ltd.

(57) ABSTRACT

A method of communicating between a rotary wing platform and a ground terminal via a satellite. The method comprises, at the rotary wing platform, receiving a forward link signal transmitted by the satellite; on the basis of the received forward link signal, estimating at least one obstruction characteristic associated with obstruction of a signal transmission path between the rotary wing platform and the satellite by one or more blades of the rotary wing platform; determining a plurality of time periods during which the at least one obstruction characteristic indicates that the signal transmission path will not be obstructed by the one or more blades of the rotary wing platform; and transmitting to the satellite a bursted carrier return link signal comprising a plurality of bursts, wherein each burst in the plurality of bursts is transmitted during one of the determined time periods.

19 Claims, 6 Drawing Sheets

(58) Field of Classification Search
CPC . G06T 2207/10016; G06T 2207/30252; G06T 7/80

See application file for complete search history.

(56) References Cited

U.S. PATENT DOCUMENTS

| | | | |
|---|---|---|---|
| 2008/0233955 A1* | 9/2008 | Narang | H04W 48/16 |
| | | | 455/434 |
| 2010/0322150 A1 | 12/2010 | Wilcoxson et al. | |
| 2010/0330926 A1* | 12/2010 | Monk | H04B 7/18506 |
| | | | 455/67.11 |
| 2011/0117911 A1* | 5/2011 | Narang | H04W 48/16 |
| | | | 455/434 |
| 2015/0055549 A1* | 2/2015 | Yamamoto | H04B 7/18543 |
| | | | 370/316 |
| 2022/0086908 A1* | 3/2022 | Myung | H04W 74/0816 |

FOREIGN PATENT DOCUMENTS

| | | |
|---|---|---|
| CN | 109533380 A | 3/2019 |
| EP | 2424127 A2 | 2/2012 |
| EP | 2833562 A1 | 2/2015 |
| JP | H0722993 A | 1/1995 |
| WO | 2008115289 A2 | 9/2008 |
| WO | 2016168253 A1 | 10/2016 |

OTHER PUBLICATIONS

United Kingdom Search Report; priority document.
Jinseok Lee et al., Frequency hopping packing algorithm for MF-TDMA with various types of satellite terminals, 2014 IEEE Military Communications Conference (MILCOM), DOI 10.1109/MILCOM.2014.105.

* cited by examiner

WIRELESS COMMUNICATION

CROSS-REFERENCES TO RELATED APPLICATIONS

This application claims the benefit of the International Application No. PCT/GB2020/051289, filed on May 28, 2020, and of the Great Britain patent application No. 1907510.0 filed on May 28, 2019, the entire disclosures of which are incorporated herein by way of reference.

FIELD OF THE INVENTION

The present disclosure concerns wireless communication. In particular, but not exclusively, this disclosure concerns wireless communication between a rotary wing platform and a satellite.

BACKGROUND OF THE INVENTION

A rotary wing platform is an aircraft that generates lift by use of one or more rotating wings or blades. Examples of rotary wing platforms include helicopters, unmanned aerial vehicles, and tiltrotor aircraft.

Rotary wing platforms may be required to communicate with or via satellites, or high-altitude pseudo-satellites (HAPS). To do so, both the satellite and the rotary wing platform comprise a radio frequency (RF) transceiver. The transceivers provide a communication link over a direct line-of-sight transmission path between the transceivers.

However, this transmission path typically passes through the path of the rotary wing platform's rotating blades. As the blades of the rotary wing platform rotate overhead, each blade repeatedly passes through the transmission path. Thus, in flight, the transmission path, and therefore the communication link, between the transceivers will suffer repeated periodic obstructions by the blades of the rotary wing platform. While the transmission path is obstructed by a blade, any data transmitted by one transceiver may be prevented from reaching the other, and may be lost. The obstruction of the transmission path by the blades therefore causes burst errors on the communication link resulting in loss of transmitted data. Forward error correction (FEC) coding may be applied in an attempt to overcome the data loss, but the redundancy introduced by this process results in a reduced link data rate and increases transceiver complexity. Furthermore, FEC coding has only a limited capability to correct for the burst errors which are characteristic of transmission path obstruction by the rotating blades of a rotary wing platform.

Furthermore, while the transmission path is obstructed, transmissions by the rotary wing platform transceiver can reflect downwards off the obstructing blade(s), presenting a radiation hazard to aircraft crew.

The present disclosure seeks to mitigate the above-mentioned problems. Alternatively or additionally, the present disclosure seeks to provide improved measures for communication between a rotary wing platform and a satellite.

SUMMARY OF THE INVENTION

The present disclosure provides, according to a first aspect, a method of communicating between a rotary wing platform and a ground terminal via a satellite, the method comprising:

receiving, at the rotary wing platform, a forward link signal transmitted by the satellite;

at the rotary wing platform, on the basis of the received forward link signal, estimating at least one obstruction characteristic associated with obstruction of a signal transmission path between the rotary wing platform and the satellite by one or more blades of the rotary wing platform;

at the rotary wing platform, determining a plurality of time periods during which the at least one obstruction characteristic indicates that the signal transmission path will not be obstructed by the one or more blades of the rotary wing platform; and at the rotary wing platform, transmitting to the satellite a bursted carrier return link signal comprising a plurality of bursts, wherein each burst in the plurality of bursts is transmitted during one of the determined time periods.

According to a second aspect of the present disclosure, there is provided a transceiver for a rotary wing platform comprising:

a receiver configured to receive a forward link signal transmitted by a satellite;

signal processing electronics, configured to estimate, on the basis of the received forward link signal, at least one obstruction characteristic associated with obstruction of a signal transmission path between the rotary wing platform and the satellite by one or more blades of the rotary wing platform and to determine a plurality of time periods during which the at least one obstruction characteristic indicates that the signal transmission path will not be obstructed by the one or more blades of the rotary wing platform; and a transmitter, configured to transmit to the satellite a bursted carrier return link signal comprising a plurality of bursts, wherein each burst in the plurality of bursts is transmitted during one of the determined time periods.

According to a third aspect of the present disclosure, there is provided a system for communicating between a rotary wing platform and a ground terminal via a satellite, comprising a rotary wing platform configured to:

receive, at the rotary wing platform, a forward link signal transmitted by the satellite;

on the basis of the received forward link signal, estimate at least one obstruction characteristic associated with obstruction of a signal transmission path between the rotary wing platform and the satellite by one or more blades of the rotary wing platform;

determine a plurality of time periods during which the at least one obstruction characteristic indicates that the signal transmission path will not be obstructed by the one or more blades of the rotary wing platform; and transmit to the satellite a bursted carrier return link signal comprising a plurality of bursts, wherein each burst in the plurality of burst is transmitted during one of the determined time periods; and a ground terminal configured to:

receive the bursted carrier signal;

on the basis of the received return link signal, identify whether at least a part of the received return link signal does not correspond to a burst; and discard the at least part.

It will of course be appreciated that features described in relation to one aspect of the present disclosure may be incorporated into other aspects of the present disclosure. For example, the method of the disclosure may incorporate any of the features described with reference to the apparatus of the disclosure and vice versa.

BRIEF DESCRIPTION OF THE DRAWINGS

Embodiments of the present disclosure will now be described by way of example only with reference to the accompanying schematic drawings of which.

DETAILED DESCRIPTION OF THE PREFERRED EMBODIMENTS

Figure 1:
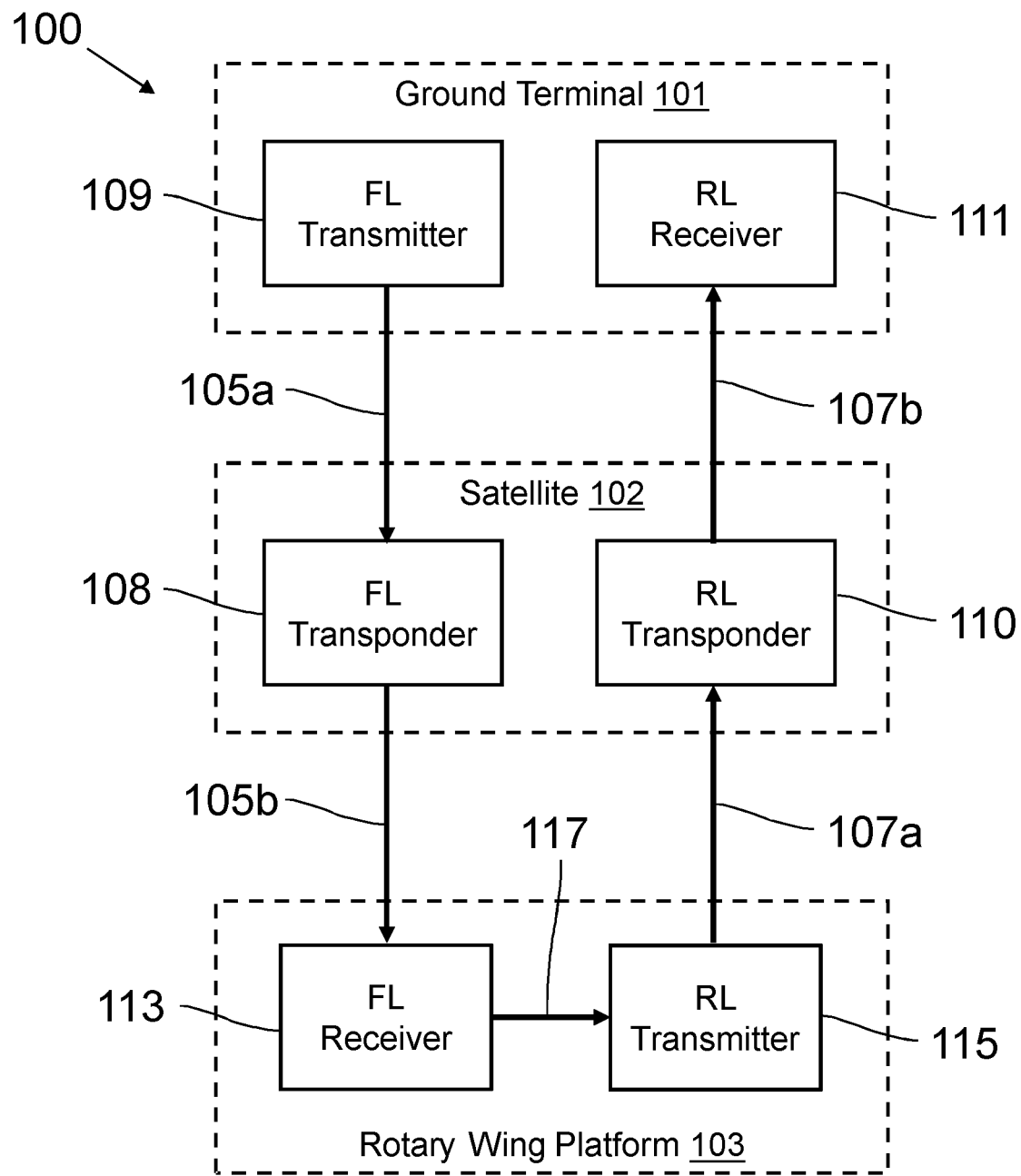
FIG. 1 shows a block diagram of a system according to embodiments of the present disclosure.

FIG. 1 shows a block diagram of a system 100 according to embodiments of the present disclosure. System 100 comprises a communications link between a ground terminal 101 and a rotary wing platform 103 via a satellite 102. The communications link comprises a forward link (FL) 105 from ground terminal 101 to rotary wing platform 103, and a return link (RL) 107 from rotary wing platform 103 to ground terminal 101. FL 105 comprises a first link 105a from ground terminal 101 to satellite 102 and a second link 105b from satellite 102 to rotary wing platform 103. RL 107 comprises a first link 107a from rotary wing platform 103 to satellite 102 and a second link 107b from satellite 102 to ground terminal 101.

Ground terminal 101 comprises a FL transmitter 109 and a RL receiver 111. Rotary wing platform 103 comprises a FL receiver 113 and a RL transmitter 115. Satellite 102 comprises a FL transponder 108 and a RL transponder 110. At ground terminal 101, FL transmitter 109 is configured to transmit FL signals to rotary wing platform 103 via FL transponder 108. FL transponder 108 is configured to forward signals received from FL transmitter 109 to rotary wing platform 103. At rotary wing platform 103, FL receiver 113 is configured to receive FL signals. Thus, FL transmitter 109, FL transponder 108, and FL receiver 113 can be said to enable FL 105. At rotary wing platform 103, RL transmitter 115 is configured to transmit RL signals to ground terminal 101 via RL transponder 110. RL transponder 110 is configured to forward signals from RL transmitter 115 to ground terminal 101. At ground terminal 101, RL receiver 111 is configured to receive RL signals. Thus, RL transmitter 115, RL transponder 110, and RL receiver 111 can be said to enable RL 107.

While in FIG. 1, FL transmitter 109 and RL receiver 111 are shown as separate units, in embodiments, FL transmitter 109 and RL receiver 111 are provided as a single satellite transceiver unit. Similarly, in embodiments, FL receiver 113 and RL transmitter 115 may be provided as a single rotary wing platform transceiver unit. In embodiments, FL transponder 108 and RL transponder 110 may be provided by a single transponder unit.

Signals transmitted over FL 105 or RL 107 will travel between ground terminal 101 and rotary wing platform 103 along a signal transmission path determined by the positions of ground terminal 101, satellite 102, and rotary wing platform 103. FL 105 and RL 107 can therefore each be said to have a signal transmission path. It will be appreciated by the skilled person that, while in FIG. 1 FL 105 and RL 107 are shown as separate arrows, signals travelling over FL 105 and signals travelling over RL 107 may follow substantially the same transmission path, albeit in opposite directions. The signal transmission path suffers periodic obstruction by one or more blades of rotary wing platform 103. The obstruction of the signal transmission path can be said to have frequency, corresponding to the regularity with which the one or more blades pass through the signal transmission path. Thus, the obstruction can also be said to have a period. The obstruction can also be said to have a mark/space ratio, indicating the ratio of a period of time during which the signal transmission path is obstructed to that during which the signal transmission path is not obstructed. It will be understood by the skilled person that it is second link 105b of FL 105 and first link 107a of RL 107 which are subjected to obstruction by blades of rotary wing platform 103.

FL transmitter 109 is configured to transmit a FL data stream. The FL data stream comprises data intended for transmission from ground terminal 101 to rotary wing platform 103 over FL 105.

In embodiments, a FL signal comprises a signal with predictable signal to noise ratio. In embodiments, the FL signal comprises a continuous carrier signal. In embodiments, the FL signal comprises a full occupancy bursted carrier signal. Thus, the FL signal may comprise a plurality of forward link bursts. In such embodiments, the FL signal may comprise a regular and evenly bursted waveform structure. In such embodiments, it may be that each of the plurality of bursts are of equal length. Thus, in embodiments, each forward link burst in the plurality of forward link bursts is of the same length, such that each forward link burst in the plurality of forward link bursts corresponds to an equal length of time. In embodiments, the plurality of forward link bursts are transmitted at substantially regular intervals. Thus, each forward link burst in the plurality of forward link bursts may be transmitted a predetermined time period (for example, substantially corresponding to a length of a forward link burst) after the preceding forward link burst. In embodiments, the FL signal comprises a combination of continuous carrier and full occupancy bursted carrier signals.

In embodiments, FL 105 uses one or more of optimized synchronization, interleaving, forward error correction, and erasure detection and insertion in order to enable reliable error-free transmission of the FL data stream from ground terminal 101 to rotary wing platform 103. These standard techniques for overcoming interference on a communication link are well known by those skilled in the art and therefore will not be discussed further here.

Figure 2:
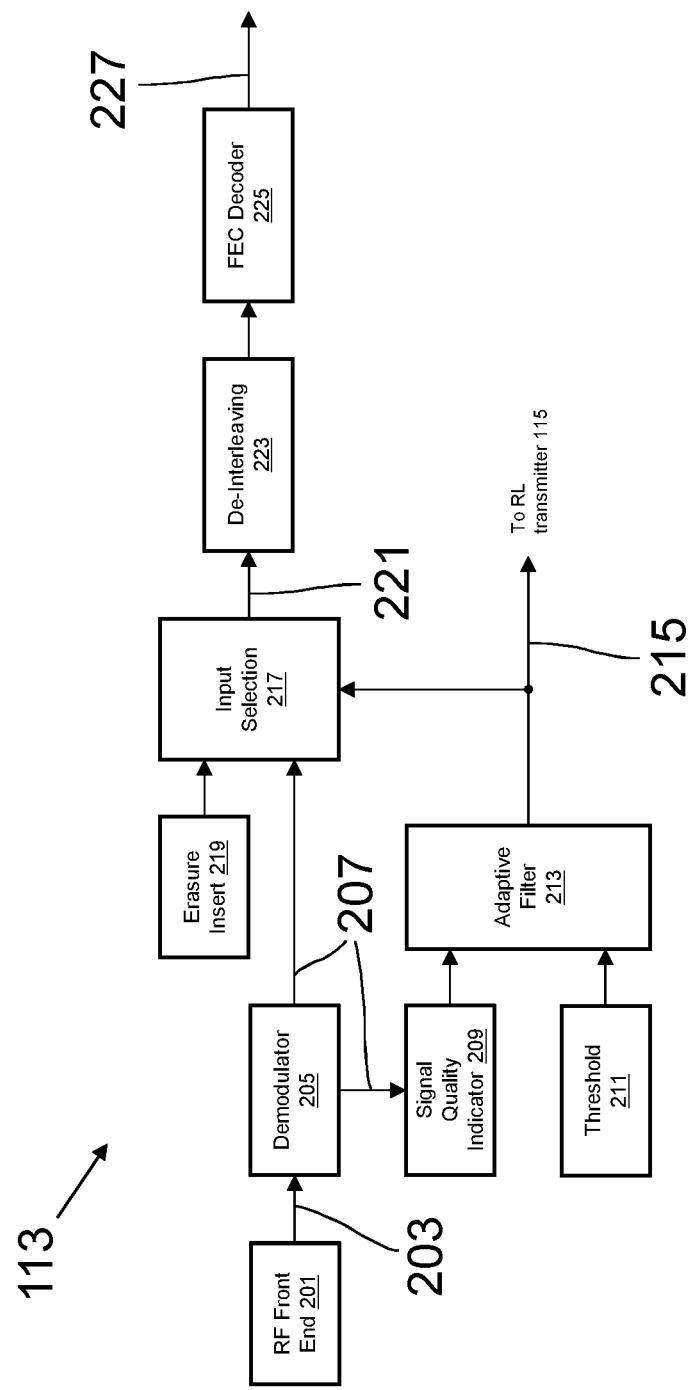
FIG. 2 shows a block diagram of the FL receiver of FIG. 1.

FIG. 2 shows a block diagram of FL receiver 113. FL receiver 113 comprises an RF front end 201. RF front end 201 is configured to receive FL signals, perform any desired down-conversion and amplification, and perform analogue to digital conversion on the received FL signals. RF front end 201 outputs a digital signal 203 corresponding to one or more signals received over FL 105.

A demodulator 205 is configured to extract a baseband signal 207 from digital signal 203. FL receiver 113 is configured to process baseband signal 207 to estimate at least one obstruction characteristic associated with obstruction of the signal transmission path between ground terminal 101 and rotary wing platform 103. In embodiments, the at least one obstruction characteristic comprises one or more of: a period of the obstruction, a mark/space ratio of the obstruction, and a phase of the obstruction.

In embodiments, FL receiver 113 is configured to process baseband signal 207 to determine a signal quality indicator 209 of the received FL signal. In embodiments, signal quality indicator 209 comprises one or more of: a received signal quality indicator, a signal to noise ratio, and an error vector magnitude (EVM). Signal quality indicator 209 provides an indication as to whether, at a given point in time, the signal transmission path is obstructed by the one or more blades of rotary wing platform 103. For example, a drop in the signal to noise ratio of the received FL signal may indicate that the signal transmission path is obstructed.

In embodiments, estimating the at least one obstruction characteristic is performed on the basis of signal quality indicator 209. In embodiments, estimating the at least one obstruction characteristic comprises comparing signal quality indicator 209 to a predetermined threshold 211. In embodiments, predetermined threshold 211 is set at a fixed level. In alternative embodiments, predetermined threshold 211 is adaptively changed in response to changes in the state of the signal transmission path. In embodiments, the signal transmission path is considered to be obstructed when the determined signal quality indicator does not exceed predetermined threshold 211. In embodiments, the at least one obstruction characteristic comprises one or both of: a period of signal quality indicator 209, and a mark/space ratio of signal quality indicator 209.

In embodiments, estimating the at least one obstruction characteristic comprises operating an adaptive filter 213 to model the signal transmission path. In embodiments, FL receiver 113 is configured to provide adaptive filter 213 with determined signal quality indicator 209 as an input. In embodiments, FL receiver 113 is configured to provide adaptive filter 213 with predetermined threshold 211 as an input. In embodiments, the modelling comprises predicting a current state of the signal transmission path. In embodiments, the modelling comprises predicting a future state of the signal transmission path. In embodiments, the state of the signal transmission path comprises an expected received signal strength of a signal transmitted over the signal transmission path.

In embodiments, FL receiver 113 is configured to determine, on the basis of the estimated at least one obstruction characteristic, a plurality of obstruction-free time periods during which the at least one obstruction characteristic indicates that the signal transmission path will not be obstructed by the one or more blades of rotary wing platform 103. In embodiments, the plurality of obstruction-free time periods are determined by use of adaptive filter 213. In embodiments, determining a plurality of obstruction-free time periods may comprise determining one or more RL 107 bursts for which the at least one obstruction characteristic indicates that the signal transmission path will not be obstructed by the one or more blades of rotary wing platform 103. Thus, in embodiments, FL receiver 113 may conceptually divide time into a plurality of granular time intervals. In embodiments, the plurality of time intervals are all of equal duration. In other embodiments, the plurality of time intervals may vary in duration (for example, in response to changes in blade pitch or rotational speed). Thus, in embodiments, determining the plurality of obstruction-free time periods comprises selecting one or more of the plurality of time intervals for which the at least one obstruction characteristic indicates that the signal transmission path will not be obstructed.

In embodiments, the duration of the time intervals is fixed in relation to a duration of the received FL 105 bursts (where the FL 105 comprises a full occupancy bursted carrier link). For example, the duration of the time intervals may correspond to a unit fraction of the duration of the received FL 105 bursts, such that an integer number of time intervals sums to the duration of a FL 105 burst. In embodiments, the time intervals are arranged such that the start and end times of a FL 105 burst correspond to the start times of two respective time intervals. Thus, the FL 105 and RL 107 bursts can be said to be aligned. It will be appreciated that there may be multiple RL 107 bursts for each FL 105 burst, such that the FL 105 bursts are aligned with, for example, one in every five RL 107 bursts. In such embodiments, the FL 105 burst and an integer number of time intervals can be said to correspond to the same period of time. It may be that each of the time intervals corresponds to a respective RL 107 burst. Thus, FL receiver 113 can, in such cases, be said to be configured to generate and utilise a uniform bursted waveform framework on the FL 105 and the RL 107. In embodiments, determining the at least one obstruction characteristic comprises determining, for each forward link burst in the plurality of forward link bursts, whether the forward link burst was successfully received at rotary wing platform 103. In such embodiments, it may be that determining the plurality of time periods comprises identifying a time period corresponding to a successfully received forward link burst.

It will be appreciated that the granularity of the obstruction characteristic is determined, at least in part, by the duration of the FL 105 bursts. Thus, in embodiments having a uniform bursted waveform framework on the FL 105 and the RL 107, FL receiver 113 may be configured to propagate the estimated obstruction characteristic to those RL 107 bursts corresponding to the obstructed FL 105 bursts. Such an embodiment can provide an efficient means for determining obstruction-free time periods in which to transmit over RL 107.

Figure 3:
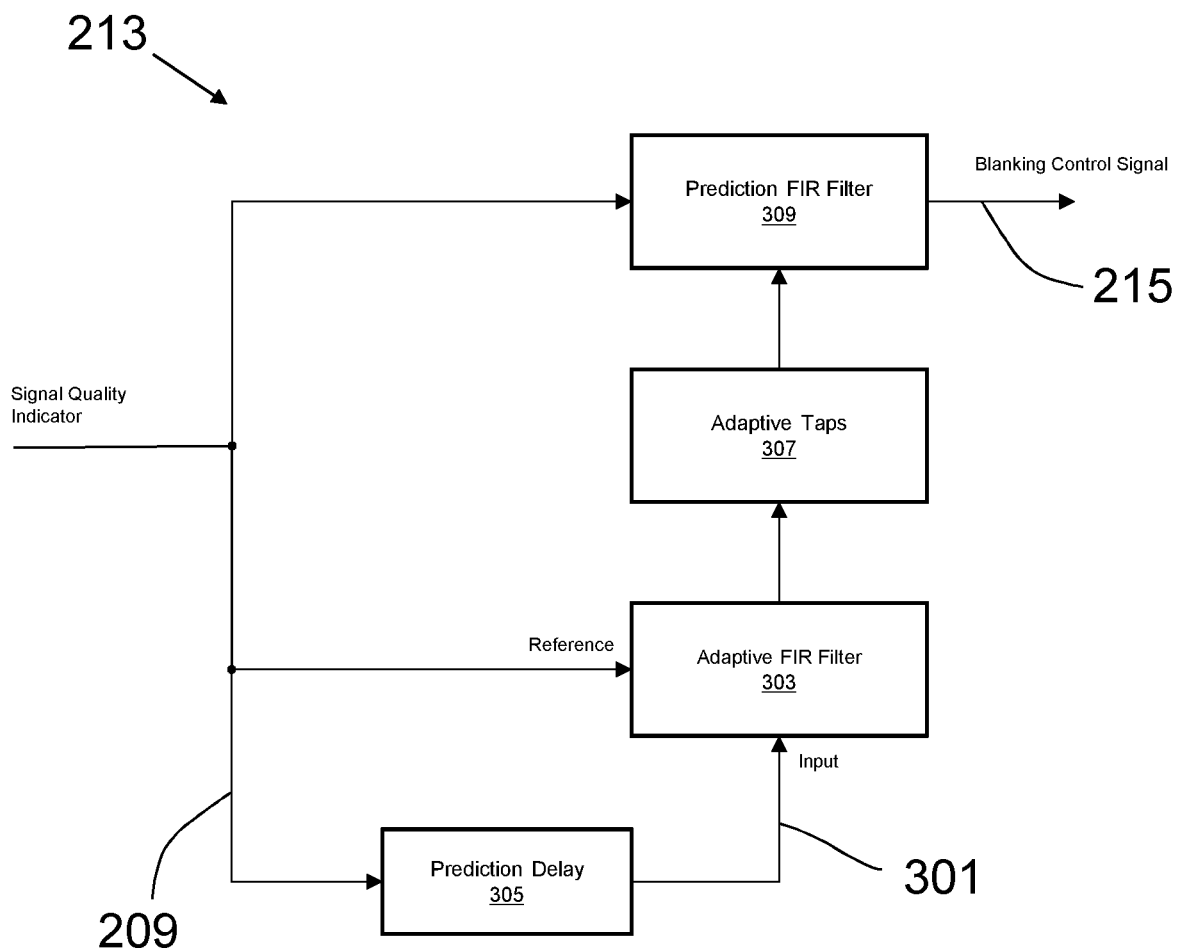
FIG. 3 shows a block diagram of the adaptive filter of FIG. 2.

FIG. 3 shows a block diagram of adaptive filter 213. Adaptive filter 213 is configured to receive as an input, signal quality indicator 209. Signal quality indicator 209 is passed to an adaptive finite impulse response (FIR) filter 303 as a reference. A second instance of signal quality indicator 209 is subjected to a prediction delay 305 and provided to adaptive FIR filter 303 as an input 301. Adaptive FIR filter 303 comprises a plurality of taps 307, for example 250 taps. It will be appreciated by the skilled person that other numbers of taps could be also used. In embodiments, the number of taps 307 is sufficient to enable adaptive FIR filter 303 to cover a period of time corresponding to multiple obstruction periods. Adaptive FIR filter 303 is configured to minimize an error between its input and reference, by adjusting a tap configuration of adaptive FIR filter 303. In embodiments, adaptive FIR filter 303 comprises a least mean squares (LMS) adaptive filter. In alternative embodiments, adaptive FIR filter 303 comprises a recursive least squares (RLS) adaptive filter.

The tap configuration of adaptive FIR filter 303 is mirrored in a prediction FIR filter 309. Prediction FIR filter 309 is provided with signal quality indicator 209 as its input, and therefore operates to predict the signal strength at a point in time in the future corresponding to a length of prediction delay 305. Thus, in embodiments, prediction FIR filter 309 is configured to predict a future state of the signal transmission path. In embodiments, prediction FIR filter 309 is configured to determine the allocation of data bearing bursts (for example, to the time intervals) on RL 107. Prediction FIR filter 309 is configured to generate a blanking control signal 215. In embodiments, prediction FIR filter 309 may be configured to generate blanking control signal 215 on the basis of receipt of non data-bearing (for example, due to obstruction by the rotor blades) FL 105 bursts.

Adaptive filter 213 therefore assists in determining a plurality of obstruction-free time periods during which the at least one obstruction characteristic indicates that the signal transmission path will not be obstructed by the one or more blades of rotary wing platform 103.

Returning to FIG. 2, blanking control signal 215 controls an input selection function 217. Input selection function 217 is configured to, in response to blanking control signal 215 indicating that the signal transmission path is not obstructed, pass baseband signal 207 through to the output 221 of input selection function 217. In response to blanking control signal 215 indicating that the signal transmission path is obstructed, input selection function 217 instead passes erasures 219 through to output 221. Thus, blanking control signal 215 controls input selection function 217 to insert erasures in the place of data received while the signal transmission path is obstructed. An erasure comprises a neutral soft decision signifying a lack of, for example no, confidence in the received data. Therefore, blanking control signal 215 can be said to control input selection function 217 to signal a lack of confidence in data received while the signal transmission path is obstructed (for example, by inserting neutral soft-decision data). Inserting erasures in the place of data received while the signal transmission path is obstructed prevents noisy or erroneous data from biasing later decoding stages, for example a forward error correction decoder. Output 221 of input selection function 217 therefore comprises a modified version of baseband signal 207, in which those portions of the received signal that correspond to periods of time when the signal transmission path was obstructed are replaced by erasures.

Output 221 of input selection function 217 is, in embodiments, processed by a de-interleaving function 223 and/or a forward error correction (FEC) decoder 225. It will be appreciated by the skilled person that de-interleaving function 223 and FEC decoder 225 are optional elements, and only required in embodiments incorporating those elements' corresponding functionalities. The output 227 of FL receiver 113 comprises the FL data stream.

Figure 4:
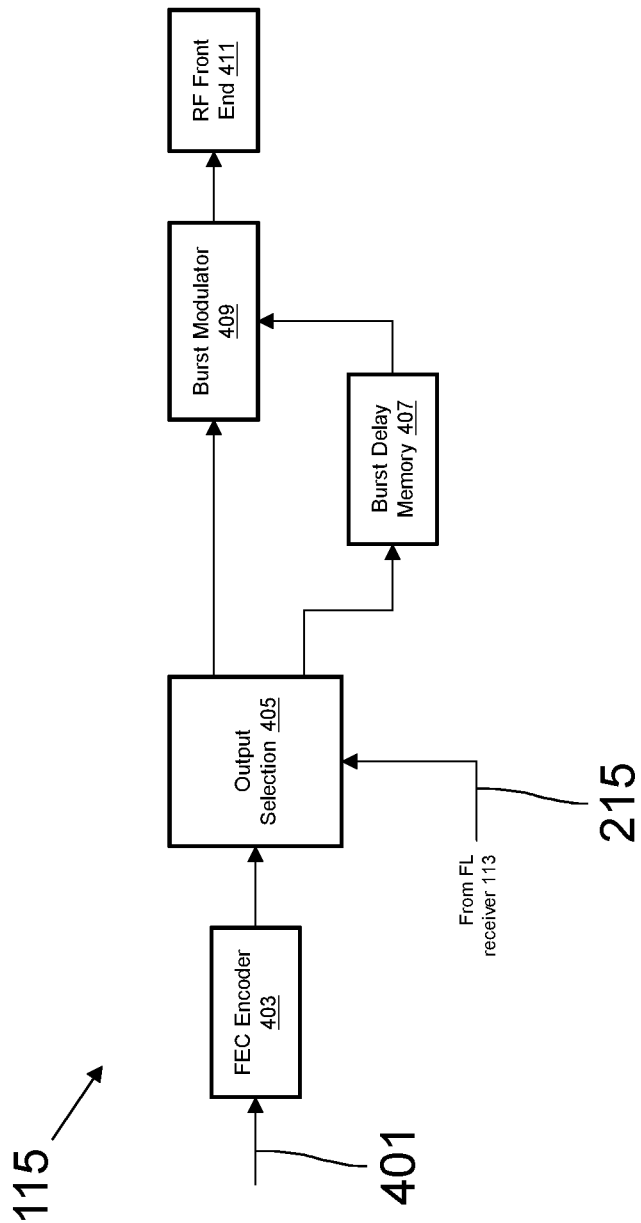
FIG. 4 shows a block diagram of the RL transmitter of FIG. 1.

FIG. 4 shows a block diagram of RL transmitter 115. RL transmitter 115 is configured to transmit to ground terminal 101 via RL transponder 110 a bursted carrier RL signal comprising a plurality of bursts. In embodiments, the plurality of bursts are all of the same duration. Thus, it may be that each of the plurality of bursts corresponds to an equal length or time, such that the plurality of bursts can be said to be even and regular. In embodiments, the plurality of bursts bear a deterministic relationship to the FL 105 bursts. For example, it may be that a duration of each of the plurality of bursts corresponds to a unit fraction of a duration of a FL 105 burst. Thus, multiple bursts in the plurality may together correspond to an associated FL 105 burst (i.e., each forward link burst corresponds to an integer number of return link bursts). In embodiments, each of the plurality of bursts corresponds to a respective one of the earlier mentioned plurality of time intervals. Each burst in the plurality of bursts is transmitted during one of the plurality of obstruction-free time periods determined by use of adaptive filter 213. Thus, in embodiments, the transmission of the return link bursts is synchronized to the receipt of the forward link bursts. In embodiments, multiple bursts in the plurality of bursts may be transmitted during a single obstruction-free time period. In embodiments, each of the plurality of bursts is 1 ms in length.

RL transmitter 115 receives RL data stream 401 for transmission to ground terminal 101 from a data source. RL data stream 401 comprises data intended for transmission from rotary wing platform 103 to ground terminal 101 over RL 107. In embodiments, data stream 401 is encoded by an FEC encoder 403 and subsequently passed to an output selection function 405. It will be appreciated by the skilled person that FEC encoder 403 is an optional element, and only required in embodiments incorporating forward error correction functionality. In embodiments, RL transmitter 115 is configured to operate FEC encoder 403 to encode the burst. In embodiments, a burst comprises data and a code-word length of the encoder is equal to a length of the data. Aligning the code-word length of a FEC encoder to the length of data in a burst simplifies the application of adaptive coding and modulation by enabling seamless transitions.

Output selection function 405 is controlled by blanking control signal 215. In embodiments, output selection function 405 is configured to, in response to blanking control signal 215 indicating that the signal transmission path will be obstructed, store bursts in a burst delay memory 407 (from which bursts are allocated). In embodiments, output selection function 405 is configured to, in response to blanking control signal 215 indicating that the signal transmission path will not be obstructed, pass bursts from burst delay memory 407 to a burst modulator 409, and subsequently on to an RF front end 411 for transmission. If burst delay memory 407 is empty, output selection function 405 passes bursts directly from its input to burst modulator 409. In embodiments, RF front end 411 comprises a separate unit to RF front end 201. In alternative embodiments, RF front end 411 and RF front end 201 comprise a single unit. In embodiments, burst delay memory 407 can be considered to store a queue of bursts. Bursts are passed to burst modulator 409 from a head of the queue, such that the first burst stored in burst delay memory 407 is the first burst to be passed to burst modulator 409. Burst delay memory can therefore be said to operate on a first-in first-out (FIFO) basis. Therefore, in embodiments, transmitting a bursted carrier RL signal comprises, in response to the at least one obstruction characteristic indicating that the transmission path is obstructed, storing a burst in a queue. In embodiments, transmitting a bursted carrier return link signal comprises, in response to the at least one obstruction characteristic indicating that the transmission path is not obstructed, transmitting a burst from a head of the queue. In other embodiments, burst delay memory 407 does not receive and store bursts, but instead acts as a standard data buffer, with the allocation of data to RL 107 bursts performed on the basis of the output of burst delay memory 407.

Thus, in embodiments, RL transmitter 115 is configured to transmit bursts only when the signal transmission path is not obstructed. Time intervals during which a burst is not transmitted can be said to be radio frequency blanked. In embodiments, the time intervals are all a fixed uniform length of time. Thus, in such embodiments, the time intervals can be said to be "atomic" and may correspond to a predetermined number of bits or symbols, rather than packets or frames. Such a burst (i.e., the length of which is fixed in terms of the number of bits/symbols and therefore also corresponds to a fixed period of time) can be referred to as a physical layer burst. It will be appreciated that a data packet generally comprises a fixed number of bits. The time period associated with the transmission of that data packet will therefore vary according to the data rate. By performing blanking of physical layer bursts rather than higher level packets or frames, it is possible to maintain a synchronized uniform bursted waveform framework on FL 105 and RL 107. Thus, such embodiments can maintain synchronization between and alignment of the FL 105 bursts and RL 107 bursts. In embodiments, the time intervals correspond to a minimum independent unit of modulation and demodulation. It may be that an obstruction period covers more than one time interval. Thus, in such cases, it may be that multiple consecutive time intervals are blanked.

Thus, in embodiments, RL transmitter 115 is configured to transmit physical layer bursts. In such embodiments, RL transmitter 115 may be configured to perform RF blanking of physical layer bursts. The use of physical layer bursts enables the decoupling of the means of managing the obstruction of the signal transmission path from the data rates and higher-layer protocols of RL 107 (e.g. Network Layer Packets and/or Transport Layer Frames). Thus, in such embodiments, burst allocation aspects such as lead-in and lead-out times are not data rate dependent. The use of physical layer bursts therefore enables an RF blanking scheme which is data rate agnostic (because the scheme operates on the basis of the time intervals rather than data packets). This can provide finer granularity blanking and an associated increase in transmission efficiency. Furthermore, such an RF blanking scheme can blank time intervals independently of one another, allowing the blanking to be localized to only those bursts affected by an obstruction (i.e., the synchronization and recovery of neighboring unblanked bursts is unaffected).

In embodiments, transmitting the bursted carrier return link signal comprises transmitting a burst when the at least one obstruction characteristic indicates that a pre-determined period of time has elapsed since the transmission path was last obstructed, and that transmission of the data bearing bursts will be completed a pre-determined period of time before the transmission path is next obstructed. Such embodiments can be said to impose a buffer period around the time period during which the transmission path is obstructed by one or more blades of rotary wing platform 103. Imposing a buffer period around a period of obstruction ensures that bursts are only transmitted when there is a high degree of certainty that transmission of the burst will not be interfered with by an obstructing blade. This helps to prevent data loss and minimizes the likelihood of RF energy being reflected downwards off the rotor blades. Furthermore, imposing such a buffer period reduces the likelihood of partially blocked bursts, which can be difficult for RL receiver 111 to determine whether to retain or discard.

Figure 5:
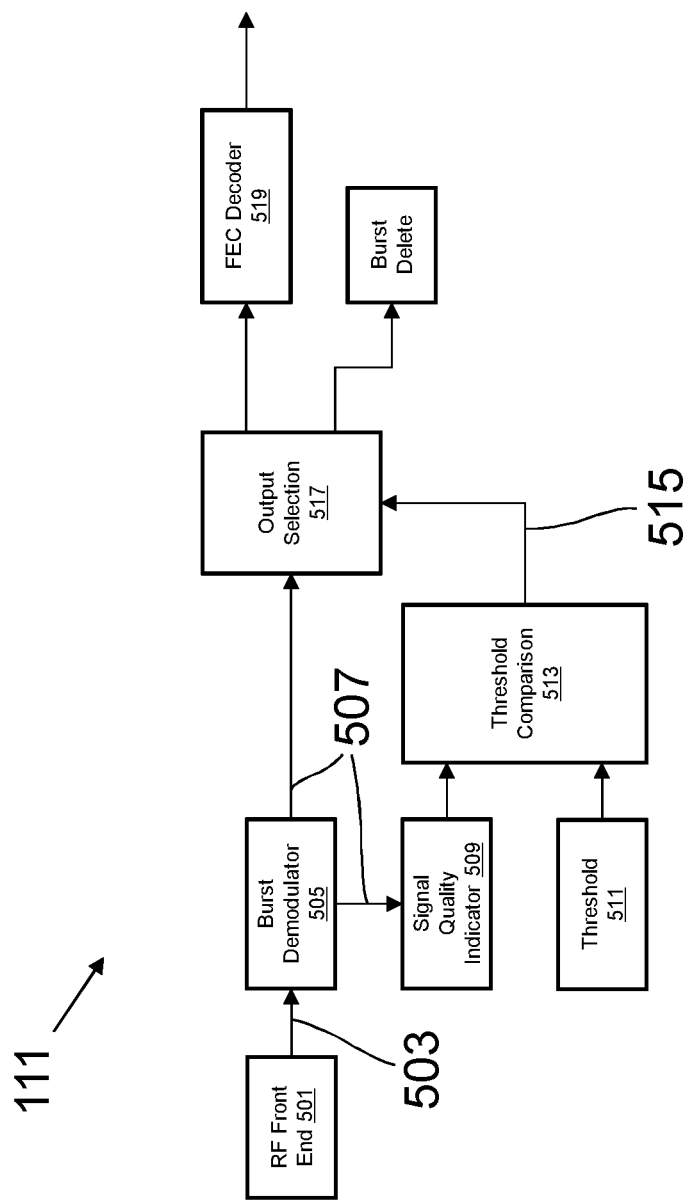
FIG. 5 shows a block diagram of the RL receiver of FIG. 1.

FIG. 5 shows a block diagram of RL receiver 111 according to embodiments of the present disclosure. RL receiver 111 comprises an RF front end 501. RF front end 501 is configured to receive RL signals, perform any desired down-conversion and amplification, and perform analogue to digital conversion of signals received over RL 107. RF front end 501 outputs a digital signal 503 corresponding to the received signals.

A burst demodulator 505 operates to extract a baseband signal 507 from digital signal 503. In embodiments, RL receiver 111 is configured to process baseband signal 507 to identify, on the basis of the received RL signal, whether at least a part of the received RL signal does not correspond to a data bearing burst. In embodiments, identifying whether the at least part corresponds to a data bearing burst comprises determining a signal quality indicator 509 of the received RL signal. In embodiments, signal quality indicator 509 comprises one or more of: a received signal strength indicator, a signal to noise ratio, and an error vector magnitude. Signal quality indicator 509 provides an indication as to whether, at a given point in time, the at least part corresponds to a data bearing burst. For example, a drop in the signal to noise ratio of the received RL signal may indicate that the at least part does not correspond to a data bearing burst. In embodiments, identifying whether the at least part corresponds to a data bearing burst comprises comparing determined signal quality indicator 509 of the received RL signal to a further predetermined threshold 511. In embodiments, the at least part is considered to correspond to a burst when the determined signal quality indicator 509 of the received RL signal exceeds the further predetermined threshold 511. In embodiments, a time duration of the at least part is equal to a time duration of a burst.

In embodiments, identifying whether at least a part of the received RL signal does not correspond to a data bearing burst comprises operating a threshold comparison 513. In embodiments, RL receiver 111 is configured to provide threshold comparison 513 with the determined signal quality indicator 509 of the received RL signal as an input. In embodiments, RL receiver 111 is configured to provide threshold comparison 513 with the further predetermined threshold 511 as an input. Threshold comparison 513 is configured to identify whether at least a part of the received RL signal does not correspond to a data bearing burst and, on the basis of the identifying, generate a burst deletion control signal 515.

Burst deletion control signal 515 controls an output selection function 517. Output selection function 517 is configured to, in response to burst deletion control signal 515 indicating that the at least part of the received RL signal does not correspond to a data bearing burst, delete the burst. In response to burst deletion control signal 515 indicating that the at least part of the received RL signal corresponds to a data bearing burst, output selection function 517 instead passes the burst to an optional FEC decoder 519. The output of FEC decoder 519 comprises a received data stream. Thus, burst deletion control signal 515 controls output selection function 517 to delete those portions of the received RL signal that do not correspond to a data bearing burst. Deleting portions of the received RL signal that do not correspond to a data bearing burst can improve the performance of FEC decoder 519 by reducing an output bit error rate of FEC decoder 519 and can improve the latency of RL 107 by removing any need for interleaving.

Thus, in embodiments, RL receiver 111 is configured to, in response to identifying that at least a part of the received return link signal does not correspond to a data bearing burst, discard the at least part.

In embodiments, transmitting the bursted carrier signal comprises operating a frequency hopping mechanism to modify the transmission frequency (or frequency channel) between successive bursts. It will be appreciated that the transmission frequency, in this context, refers to the center frequency. In embodiments, RL transmitter 115 is configured to modify the transmission frequency after every burst. In alternative embodiments, RL transmitter 115 is configured to modify the transmission frequency after transmission of a predetermined number of bursts. In embodiments, RL transmitter 115 is configured to seamlessly transition between hopped and non-hopped modes of operation. Thus, RL transmitter 115 may be configured to transition between hopped and non-hopped modes "on the fly" In embodiments, the seamless transitions may be facilitated by the use of physical layer bursts. In such embodiments, the two modes of operation use common modulation, coding, and interleaving techniques and share an identical approach to obstruction detection and RF blanking Thus, in such cases, the two modes of operation can be said to have identical time domain approaches to RF blanking in which the RF blanking is independent of center frequency.

The overall operation of system 100 can be summarized as follows. FL transmitter 109 transmits a signal over FL 105, which is received by FL receiver 113. At FL receiver 113, RF front end 201 performs any desired down-conversion and amplification, digitizes the received FL signal, and passes the digitized signal 203 to demodulator 205. Demodulator 205 extracts a baseband signal 207 corresponding to the received FL signal. On the basis of extracted baseband signal 207, FL receiver 113 determines signal quality indicator 209. Adaptive filter 213 operates to estimate, on the basis of determined signal quality indicator 209 and predetermined threshold 211, at least one obstruction characteristic associated with obstruction of the signal transmission path between ground terminal 101 and rotary wing platform 103. Adaptive filter 213 determines a plurality of time periods during which the at least one obstruction characteristic indicates that the signal transmission path will not be obstructed by the one or more blades of rotary wing platform 103. Adaptive filter 213 generates, on the basis of the determined plurality of time periods, blanking signal 215 to control input selection function 217. Blanking signal 215 controls input selection function to accept data received while the signal transmission path is not obstructed, and to erase data received while the signal transmission path is obstructed. De-interleaving function 223 and FEC decoder 225 process the output of input selection function 217 to decode the received data stream and extract the received data.

Meanwhile, RL transmitter 115 receives data stream 401 for transmission to ground terminal 101 from a data source. FEC encoder 403 encodes data stream 401 and passes it to output selection function 405. Controlled by blanking control signal 215, output selection function 405 stores data in burst delay memory 407 when the signal transmission path will be obstructed, and, when the signal transmission path will not be obstructed, allocates data (for example, retrieved from burst delay memory 407) to RL 107 bursts and transmits those bursts. In embodiments, RL transmitter 115 is further configured to, on the basis of blanking control signal 215, perform RF blanking of RL 107. Performing RF blanking of RL 107 reduces reflection and scattering of transmitted RF radiation by the rotor blades.

RF front end 501 of RL receiver 111 receives signals transmitted over RL 107, performs any desired down-conversion and amplification, and digitizes the received RL signals. Burst demodulator 505 extracts a baseband signal 507 from digitized signal 503. On the basis of extracted baseband signal 507, RL receiver 111 determines signal quality indicator 509. Threshold comparison 513 operates to estimate, on the basis of determined signal quality indicator 509 and further predetermined threshold 511, whether at least a part of the received RL signal does not correspond to a data bearing burst. On the basis of the estimation, threshold comparison 513 generates a burst deletion control signal 515. Under the control of burst deletion control signal 515, output selection function 517 deletes parts of the received signal that are estimated not to correspond to a data bearing burst, and passes those parts of the received signal that are estimated to correspond to data bearing bursts to FEC decoder 519. FEC decoder 519 decodes the received bursts and passes the extracted data to a data sink.

It will be appreciated by the skilled person that, in embodiments of the present disclosure, data passes across FL 105 and across RL 107 concurrently, such that data is simultaneously received by FL receiver 113 and transmitted by RL transmitter 115.

Embodiments of the present disclosure also provide a transceiver for a rotary wing platform. The transceiver comprises a receiver, signal processing electronics, and a transmitter. The receiver is configured to receive a forward link signal transmitted by a satellite. The signal processing electronics are configured to estimate, on the basis of the received forward link signal, at least one obstruction characteristic associated with obstruction of a signal transmission path between the rotary wing platform and the satellite by one or more blades of the rotary wing platform and to determine a plurality of obstruction-free time periods during which the at least one obstruction characteristic indicates that the signal transmission path will not be obstructed by the one or more blades of the rotary wing platform. The transmitter is configured to transmit to the satellite a bursted carrier return link signal comprising a plurality of bursts, wherein each burst in the plurality of bursts is transmitted during one of the determined obstruction-free time periods.

Figure 6:
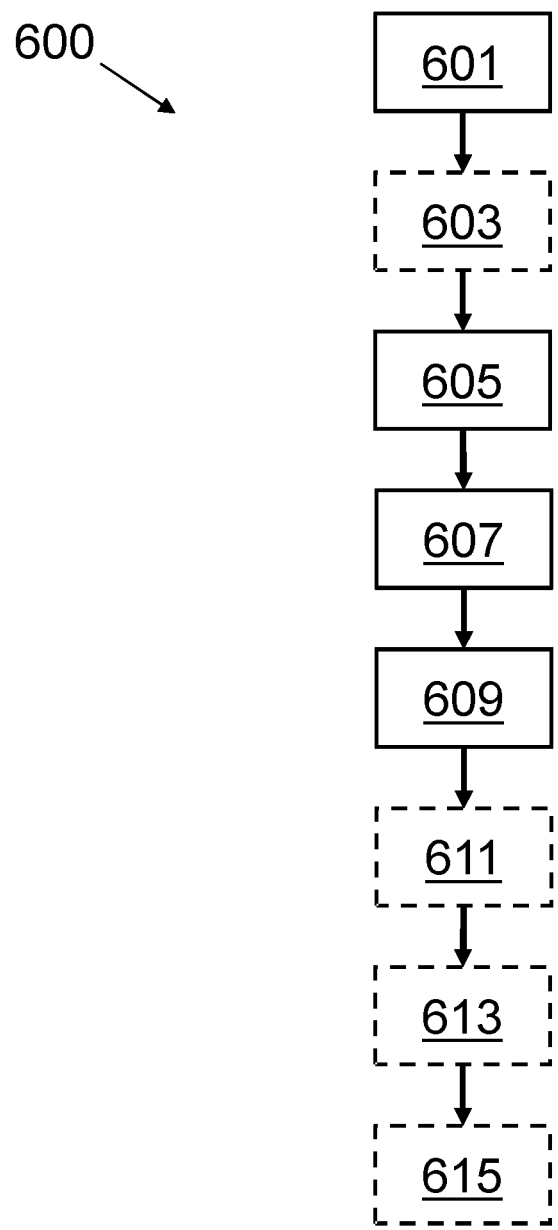
FIG. 6 shows a flow chart illustrating the steps of a method according to embodiments of the present disclosure.

FIG. 6 shows a flow chart illustrating the steps of a method according to embodiments of the present disclosure. A first step of the method, represented by item 601, comprises receiving, at a rotary wing platform, a forward link signal transmitted by a ground terminal via a satellite. In embodiments, the received forward link signal comprises a continuous carrier signal. In embodiments, the received forward link signal comprises a full occupancy bursted carrier signal.

An optional second step of the method, represented by item 603, comprises determining a signal quality indicator of the received forward link signal. In embodiments, the signal quality indicator comprises one or more of: received signal strength indicator, signal to noise ratio, and an error vector magnitude.

A third step of the method, represented by item 605, comprises, at the rotary wing platform, on the basis of the received forward link signal, estimating at least one obstruction characteristic associated with obstruction of a signal transmission path between the rotary wing platform and the satellite by one or more blades of the rotary wing platform. In embodiments, estimating the at least one obstruction characteristic is performed on the basis of the determined signal quality indicator. In embodiments, estimating the at least one obstruction characteristic comprises comparing the determined signal quality indicator to a predetermined threshold. In embodiments, the signal transmission path is considered to be obstructed when the determined signal quality indicator does not exceed the predetermined threshold. In embodiments, the at least one obstruction characteristic comprises one or more of: a period, a mark/space ratio, and a phase.

Embodiments may comprise a step of providing an adaptive filter with the determined signal quality indicator as an input. Embodiments may comprise a step of providing the adaptive filter with the predetermined threshold as an input. In embodiments, estimating the at least one obstruction characteristic comprises operating the adaptive filter to model the signal transmission path. In embodiments, the modelling comprises predicting a current state of the signal transmission path. In embodiments, the modelling comprises predicting a future state of the signal transmission path.

A fourth step of the method, represented by item 607, comprises, at the rotary wing platform, determining a plurality of obstruction-free time periods during which the at least one obstruction characteristic indicates that the signal transmission path will not be obstructed by the one or more blades of the rotary wing platform.

Embodiments may comprise a step of, at the rotary wing platform, operating a forward error correction encoder to encode each burst in the plurality of bursts. In embodiments, a burst comprises data and a code-word length of the encoder is equal to a length of the data.

A fifth step of the method, represented by item 609, comprises, at the rotary wing platform, transmitting to the ground terminal via the satellite a bursted carrier return link signal comprising a plurality of bursts. Each burst in the plurality of bursts is transmitted during one of the determined obstruction-free time periods. In embodiments, transmitting the bursted carrier return link signal comprises, in response to the at least one obstruction characteristic indicating that the transmission path is obstructed, storing a burst in a queue for later transmission. In embodiments, storing a burst in the queue comprises allocating the burst to a later time interval for transmission. In embodiments, transmitting the bursted carrier return link signal comprises, in response to the at least one obstruction characteristic indicating that the transmission path is not obstructed, allocating data to bursts (for example, retrieved from the head of the queue) and transmitting those bursts during an obstruction-free period of time. In embodiments, transmitting the bursted carrier return link signal comprises transmitting data bearing bursts when the at least one obstruction characteristic indicates that a pre-determined period of time has elapsed since the transmission path was last obstructed, and that transmission of the burst will be completed a pre-determined period of time (for example, a predetermined number of time intervals, or a predetermined number of RL 107 burst durations) before the transmission path is next obstructed. In embodiments, transmitting the bursted carrier signal comprises operating a frequency hopping mechanism to modify the transmission frequency between successive bursts.

An optional sixth step of the method, represented by item 611, comprises, at the ground terminal, receiving the return link signal.

An optional seventh step of the method, represented by item 613, comprises, at the ground terminal, on the basis of the received return link signal, identifying that at least a part of the received return link signal does not correspond to a data bearing burst. In embodiments, the identifying comprises determining a signal quality indicator of the received return link signal. In embodiments, the identifying comprises comparing the determined signal quality indicator of the received return link signal to a further predetermined threshold. In embodiments, the at least part is considered to correspond to be a burst when the determined signal quality indicator of the received return link signal exceeds the further predetermined threshold.

An optional eighth step of the method, represented by item 615, comprises, at the ground terminal, discarding the at least part. In embodiments, a time duration of the at least part is equal to a time duration of a burst.

While the present disclosure has been described and illustrated with reference to particular embodiments, it will be appreciated by those of ordinary skill in the art that the disclosure lends itself to many different variations not specifically illustrated herein. By way of example only, certain possible variations will now be described.

While embodiments of the present disclosure have been described in relation to communication between a rotary wing platform and a ground terminal via a satellite, the skilled person will appreciate that embodiments of the present disclosure are equally applicable to other applications in which a communication link suffers repeated, periodic or aperiodic obstruction. For example, embodiments of the present disclosure may be applied to communication by a rotary wing platform with a ground terminal via any high altitude platform, for example a high altitude pseudo satellite (HAPS), unmanned aerial vehicle (UAV), or balloon. Similarly, embodiments of the present disclosure may be applied to communication via any of the above listed platforms by, for example, a train, which may suffer periodic or aperiodic interference as it travels under overhead gantries. Embodiments of the present disclosure may find application in any communication link that suffers from periodic interruption, for example a communication link that is targeted by a pulse jammer.

It will be appreciated by the skilled person that ground terminal 101 need not necessarily be located on the ground. For example, in alternative embodiments, ground terminal 101 may be mounted on a fixed-wing aircraft or a ship.

Embodiments comprise a method of communicating between a rotary wing platform and a ground terminal via a high altitude platform, the method comprising:
- receiving, at the rotary wing platform, a forward link signal transmitted by the high altitude platform;
- at the rotary wing platform, on the basis of the received forward link signal, estimating at least one obstruction characteristic associated with obstruction of a signal transmission path between the rotary wing platform and the high altitude platform by one or more blades of the rotary wing platform;
- at the rotary wing platform, determining a plurality of obstruction-free time periods during which the at least one obstruction characteristic indicates that the signal transmission path will not be obstructed by the one or more blades of the rotary wing platform; and
- at the rotary wing platform, transmitting to the high altitude platform a bursted carrier return link signal comprising a plurality of bursts, wherein each burst in the plurality of bursts is transmitted during one of the determined time periods.

Embodiments comprise a method of communicating with a high altitude platform (for example a satellite), the method comprising:
- receiving a forward link signal transmitted by the high altitude platform;
- on the basis of the received forward link signal, estimating at least one obstruction characteristic associated with obstruction of a signal transmission path to the high altitude platform;
- determining a plurality of obstruction-free time periods during which the at least one obstruction characteristic indicates that the signal transmission path will not be obstructed; and
- transmitting to the high altitude platform a bursted carrier return link signal comprising a plurality of bursts, wherein each burst in the plurality of bursts is transmitted during one of the determined time periods.

Where in the foregoing description, integers or elements are mentioned which have known, obvious or foreseeable equivalents, then such equivalents are herein incorporated as if individually set forth. Reference should be made to the claims for determining the true scope of the present disclosure, which should be construed so as to encompass any such equivalents. It will also be appreciated by the reader that integers or features of the present disclosure that are described as preferable, advantageous, convenient or the like are optional and do not limit the scope of the independent claims. Moreover, it is to be understood that such optional integers or features, while of possible benefit in some embodiments of the disclosure, may not be desirable, and may therefore be absent, in other embodiments.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method of communicating between a rotary wing platform and a ground terminal via a satellite, the method comprising:
    receiving, at the rotary wing platform, a forward link signal transmitted by the satellite;
    at the rotary wing platform, based on the received forward link signal, estimating at least one obstruction characteristic associated with obstruction of a signal transmission path between the rotary wing platform and the satellite by one or more blades of the rotary wing platform;
    at the rotary wing platform, determining a plurality of time periods during which the at least one obstruction characteristic indicates that the signal transmission path will not be obstructed by the one or more blades of the rotary wing platform; and
    at the rotary wing platform, transmitting to the satellite a bursted carrier return link signal comprising a plurality of bursts, wherein each burst in the plurality of bursts is transmitted during one of the determined time periods,
    wherein transmitting the bursted carrier return link signal comprises operating a frequency hopping mechanism to modify a transmission frequency between successive bursts.

2. The method of claim 1 comprising, at the rotary wing platform, determining a signal quality indicator of the received forward link signal, wherein:
    the signal quality indicator comprises one or more of: a received signal strength indicator, a signal to noise ratio, and an error vector magnitude; estimating the at least one obstruction characteristic is performed based on the determined signal quality indicator; and estimating the at least one obstruction characteristic comprises comparing the determined signal quality indicator to a predetermined threshold, wherein the signal transmission path is considered to be obstructed when the determined signal quality indicator does not exceed the predetermined threshold.

3. The method of claim 1, wherein estimating the at least one obstruction characteristic comprises:
    operating an adaptive filter to model the signal transmission path; and providing the adaptive filter with the determined signal quality indicator as an input.

4. The method of claim 3, wherein the modelling comprises:
    predicting a current state of the signal transmission path, or
    predicting a future state of the signal transmission path.

5. The method of claim 1, wherein transmitting the bursted carrier return link signal comprises:
    in response to the at least one obstruction characteristic indicating that the transmission path is obstructed, storing a burst in a queue for later transmission; and in response to the at least one obstruction characteristic indicating that the transmission path is not obstructed, transmitting a burst from a head of the queue.

6. The method of claim 1, wherein transmitting the bursted carrier return link signal comprises transmitting a burst when the at least one obstruction characteristic indicates that a pre-determined period of time has elapsed since the transmission path was last obstructed, and that transmission of the burst will be completed a pre-determined period of time before the transmission path is next obstructed.

7. The method of claim 6, wherein determining the plurality of time periods comprises identifying a time period corresponding to a successfully received forward link burst.

8. The method of claim 1 further comprising:
    at a ground terminal, receiving the return link signal;
    at the ground terminal, based on the received return link signal, identifying that at least a part of the received return link signal does not correspond to a burst; and
    at the ground terminal, discarding the at least part.

9. The method of claim 8, wherein the identifying comprises:
    determining a signal quality indicator of the received return link signal; and
    comparing the determined signal quality indicator of the received return link signal to a further predetermined threshold, wherein the at least part is considered to correspond to be a burst when the determined signal quality indicator of the received return link signal exceeds the further predetermined threshold.

10. The method of claim 8, wherein a time duration of the at least part is equal to a time duration of a burst.

11. The method of claim 1 comprising, at the rotary wing platform, operating a forward error correction encoder to encode each burst in the plurality of bursts, wherein a burst comprises data and a code-word length of the encoder is equal to a length of the data.

12. The method of claim 1, wherein the received forward link signal comprises a continuous carrier signal.

13. The method of claim 1, wherein the received forward link signal comprises a full occupancy bursted carrier signal comprising a plurality of forward link bursts.

14. The method of claim 13, wherein estimating at least one obstruction characteristic comprises determining, for each forward link burst in the plurality of forward link bursts, whether the forward link burst was successfully received at the rotary wing platform.

15. The method of claim 13, wherein:
    each forward link burst in the plurality of forward link bursts is of the same length, such that each forward link burst in the plurality of forward link bursts corresponds to an equal length of time; and
    the plurality of forward link bursts are transmitted at substantially regular intervals.

16. The method of claim 13, wherein:
- the plurality of bursts of the bursted carrier return link signal are all of the same length, such that each of the plurality of bursts corresponds to an equal length of time; and
- a length of each of the plurality of bursts is a unit fraction of the length of a forward link burst, such that each forward link burst corresponds to an integer number of return link bursts.

17. The method of claim 13, wherein the transmission of the return link bursts is synchronized to the receipt of the forward link bursts.

18. A transceiver for a rotary wing platform comprising:
- a receiver configured to receive a forward link signal transmitted by a satellite;
- signal processing electronics, configured to estimate, based on the received forward link signal, at least one obstruction characteristic associated with obstruction of a signal transmission path between the rotary wing platform and the satellite by one or more blades of the rotary wing platform and to determine a plurality of time periods during which the at least one obstruction characteristic indicates that the signal transmission path will not be obstructed by the one or more blades of the rotary wing platform; and
- a transmitter, configured to transmit to the satellite a bursted carrier return link signal comprising a plurality of bursts, wherein each burst in the plurality of bursts is transmitted during one of the determined time periods, wherein the bursted carrier return link signal is transmitted by operating a frequency hopping mechanism to modify a transmission frequency between successive bursts.

19. A system for communicating between a rotary wing platform and a ground terminal via a satellite, comprising a rotary wing platform configured to:
- receive, at the rotary wing platform, a forward link signal transmitted by the satellite;
- based on the received forward link signal, estimate at least one obstruction characteristic associated with obstruction of a signal transmission path between the rotary wing platform and the satellite by one or more blades of the rotary wing platform;
- determine a plurality of time periods during which the at least one obstruction characteristic indicates that the signal transmission path will not be obstructed by the one or more blades of the rotary wing platform; and
- transmit to the satellite a bursted carrier return link signal comprising a plurality of bursts, wherein each burst in the plurality of bursts is transmitted during one of the determined time periods, wherein the bursted carrier return link signal is transmitted by operating a frequency hopping mechanism to modify a transmission frequency between successive bursts; and a ground terminal configured to:
- receive the bursted carrier return link signal;
- on the basis of the received return link signal, identify whether at least a part of the received return link signal does not correspond to a burst; and
- discard the at least part.

\* \* \* \* \*